US011770091B1

(12) United States Patent
Liu

(10) Patent No.: US 11,770,091 B1
(45) Date of Patent: Sep. 26, 2023

(54) THREE-PHASE DIGITAL POWER INVERTER SYSTEM FOR MOTOR CONTROLLING

(71) Applicant: Milo Enterprises Inc., Vancouver (CA)

(72) Inventor: Michael Liu, Vancouver (CA)

( * ) Notice: Subject to any disclaimer, the term of this patent is extended or adjusted under 35 U.S.C. 154(b) by 0 days.

(21) Appl. No.: 17/750,298

(22) Filed: May 21, 2022

(51) Int. Cl.
| | |
|---|---|
| *H02P 27/08* | (2006.01) |
| *H02P 29/032* | (2016.01) |
| *H02M 7/5387* | (2007.01) |
| *H02M 7/5395* | (2006.01) |

(52) U.S. Cl.
CPC ........ *H02P 27/085* (2013.01); *H02M 7/5395* (2013.01); *H02M 7/53873* (2013.01); *H02P 29/032* (2016.02)

(58) Field of Classification Search
CPC ............................ H02P 27/085; H02P 29/032; H02M 7/53873; H02M 7/5395
See application file for complete search history.

(56) References Cited

U.S. PATENT DOCUMENTS

| | | | | | |
|---|---|---|---|---|---|
| 4,916,431 | A | * | 4/1990 | Gearey ................. | B60Q 1/441 340/459 |
| 5,506,484 | A | * | 4/1996 | Munro ............. | H02M 7/53873 318/599 |
| 7,119,506 | B1 | * | 10/2006 | Kamiya .................... | B60L 3/04 318/560 |
| 2015/0224845 | A1 | * | 8/2015 | Anderson ............ | B60G 17/019 701/37 |
| 2020/0244201 | A1 | * | 7/2020 | Nishijima ............... | H02P 25/22 |

\* cited by examiner

*Primary Examiner* — Rina I Duda
(74) *Attorney, Agent, or Firm* — Raymond Y. Chan; David & Raymond Patent Firm

(57) ABSTRACT

A three-phase digital power inverter system controlled by a MCU thereof is provided, wherein during a constant current power source for accelerator control in combination with a three-wire potentiometer are inputted to a MCU for qualification and calculation base on a computation algorithm to obtain data, an accelerator line state and a brake line state are detected simultaneously for whether they are working well individually, so as to effectively prevent any electrical failure due to mechanical failure of the accelerator or the brake or open circuit/short circuit of the accelerator line or the brake line that may cause accident due to out of control of the accelerator or brake respectively. These are the potential risk factors of electric motor vehicles while the present invention can substantially eliminate such potential factor and provide a more reliable performance of electric motor vehicles.

9 Claims, 7 Drawing Sheets

THREE-PHASE DIGITAL POWER INVERTER SYSTEM FOR MOTOR CONTROLLING

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to electric power inverter, and more particular to an three-phase digital power inverter system adapted to expand power conversion into a three-phase AC output with three-phase motor driving capability integrated with artificial intelligence so as to fulfill a three-phase power supply demand and to meet the power demand of three-phase load or three-phase motor drive.

Description of Related Arts

Heavy loading machines, including motor vehicles, consume huge electric power when in actuating. If such a machine is to be actuated, several folds of monetary amount must be paid to purchase an electric power inverter with several folds of functional specification for actuating a small machine. For example, a sand wheel needs 200 W for running, while the transient power for actuating is over 1000 W. Therefore, an electric inverter of 1000 W must be configured to limit electric power for each AC phase by triggering a protecting loop to shut outputting in corresponding to the detecting signal from a detecting loop when the output terminal is given a heavy load, thereby the interior electronic elements are protected. In addition, the conventional design has to trigger a protecting line according to the detecting of the output state to turn off the system to protect the product. Alternatively, the conventional electric power inverter may render the internal detecting loop thereof to mistake a case for a loading short circuit, such that the output terminal thereof is connected with an inductive load or in actuating a load with a larger current. Thereby, a protection loop is triggered to shut outputting to protect element safe in short load.

U.S. Pat. No. 6,646,849 disclosed a digital power inverter which provides a CPU to replaced dedicated IC to distinguish a short circuit from an inductive load, that is adapted to be used as a protection circuit module to protect the elements of the power inverter from being damaged and to be capable of providing the actuating power for a machine. However, due to the development of various technologies, there are different characteristics derived a variety of product although their core technology is the shared digital power supply. There are unsolved problems and technical demands on integrating the variety of traditional hardware circuit technology with artificial intelligence, replacing by CPU dependence on software, simplifying the complexity of the circuit, and reducing the procurement cost of hardware devices.

SUMMARY OF THE PRESENT INVENTION

The invention is advantageous in that it provides an three-phase digital power inverter system which integrates a variety of hardware circuit technologies with artificial intelligence to replace by MCU dependence on software so as to simplify the complexity of the circuits and reduce the procurement cost of hardware devices.

Another advantageous of the invention is to provide an three-phase digital power inverter system which includes a three-phase digital power inverter arranged to expand power conversion into a three-phase AC output with three-phase motor driving capability integrated with artificial intelligence so as to fulfill a three-phase power supply demand and to meet the power demand of three-phase load or three-phase motor drive Another advantageous of the invention is to provide an three-phase digital power inverter system which provides digital power supply with the MCU as the control core to quantitatively analyze and process the input and output information and to automatically make corresponding adjustments to the input and output.

Another advantageous of the invention is to provide an three-phase digital power inverter system which can process a transmission of various digital information so as to be intercommunicated and interconnected with other digital devices, so as to achieve a human-computer interaction, that is a user interface where interactions between humans and machines occur to allow effective operation and control of the machine from the human end, while the machine simultaneously feeds back information that aids the operators' decision-making process, as well a remote control of intelligent devices.

Another advantage of the invention is to provide a three-phase power inverter which is adapted to achieve a two-way transmission and control of accurate data so as to simplify hardware circuit and improve the controllability and stability of equipment that substantially solve the difficulties of integration of the complex structure of traditional integrated circuits and the quantifying of input and output data and the traditional problems of one-way blind mechanical controlling.

According to the present invention, the foregoing and other objects and advantages are attained by a digital power inverter system for motor controlling, which comprises:

a main circuitry which comprises an output loop circuit, a detecting circuit, a constant current power source circuit, a communication chip circuit, two voltage regulation circuits and a CPU circuit, wherein the constant current power source circuit comprises a first power wire, a second power wire and a third power wire, wherein the voltage regulation circuits are arranged for internal stable supply voltage, wherein the communication chip circuit comprises a communication chip, wherein the CPU circuit comprises a CPU selected from a group consisting of a MCU and a DSP, wherein the detecting circuit comprises an overload detecting, a current detecting circuit for current sampling, a voltage detecting circuit for voltage sampling and a temperature detecting circuit for temperature sampling, which are arranged between the CPU circuit and the output loop circuit in such a manner that the current sampling, voltage sampling and temperature sampling are inputted to the CPU for quantification and calculation through a computation algorithm A=B+C, where A is a first resistance of the first power wire, B is a second resistance of the second power wire and C is a third resistance of the third power wire, and then expands to the communication chip of the communication chip circuit so as to achieve a data exchange;

a high voltage driving circuitry which comprises an AC driving circuit which is configured to output multi-phase AC power, a load controller circuit and an inverting circuit which is arranged between the AC driving circuit and the load controller circuit and includes a three-phase half bridge circuit configured to selectively output three-phase power or two-phase power to obtain a single-phase power output, determining by output signals of the CPU; and a DC to DC circuitry comprising a power driving circuit, a step-down/step-up circuit and a power converting circuit, wherein the power driving circuit is configured to provide a circuit function and a digital inverter function, wherein the CPU outputs PWM control for the power driving circuit and the power converting circuit is configured to output a half-bridge output such that the step down/step up circuit is arranged to be able to selectively be a direct output connected to a DC load through the load controller circuit and becomes a step-down circuit, or connected to one or more transformers and becomes a step-up circuit;

thereby an accelerator control and a brake control to a rotation of a motor equipped with the digital power inverter system are achieved by combining the first, second and third power wires to input to the CPU for computation through the software computation algorithm A=B+C, one or more failure state detections of accelerating and braking of the rotation of the motor are accomplished.

In accordance with another aspect of the invention, the present invention comprises a motor controlling process comprising steps of:

controlling three half-bridges of the three-phase half-bridge circuit of the inverting circuitry through the three-phase PWM outputs from the PWM half-bridge chips connected to the CPU to achieve a three-phase AC power output;

inputting variable resistances of the first, second and third power wires powered by the constant current power source circuit as accelerator control signals to the CPU for quantification and calculation so as to effectively control a rotation speed of a motor and to determine a failure state according to the software computation algorithm A=B+C, so as to prevent any failure of an accelerator controller device from causing the rotation speed of the motor to run out of control; and inputting variable resistances of the first, second and third power wires powered by the constant current power source circuit as brake control signals to the CPU for quantification and calculation so as to effectively control the rotation speed of the motor and to determine a failure state according to the computation algorithm A=B+C, so as to prevent any failure of a brake controller device from causing the motor to brake or brake failure.

Still further objects and advantages will become apparent from a consideration of the ensuing description and drawings.

These and other objectives, features, and advantages of the present invention will become apparent from the following detailed description, the accompanying drawings, and the appended claims.

Figure 1:
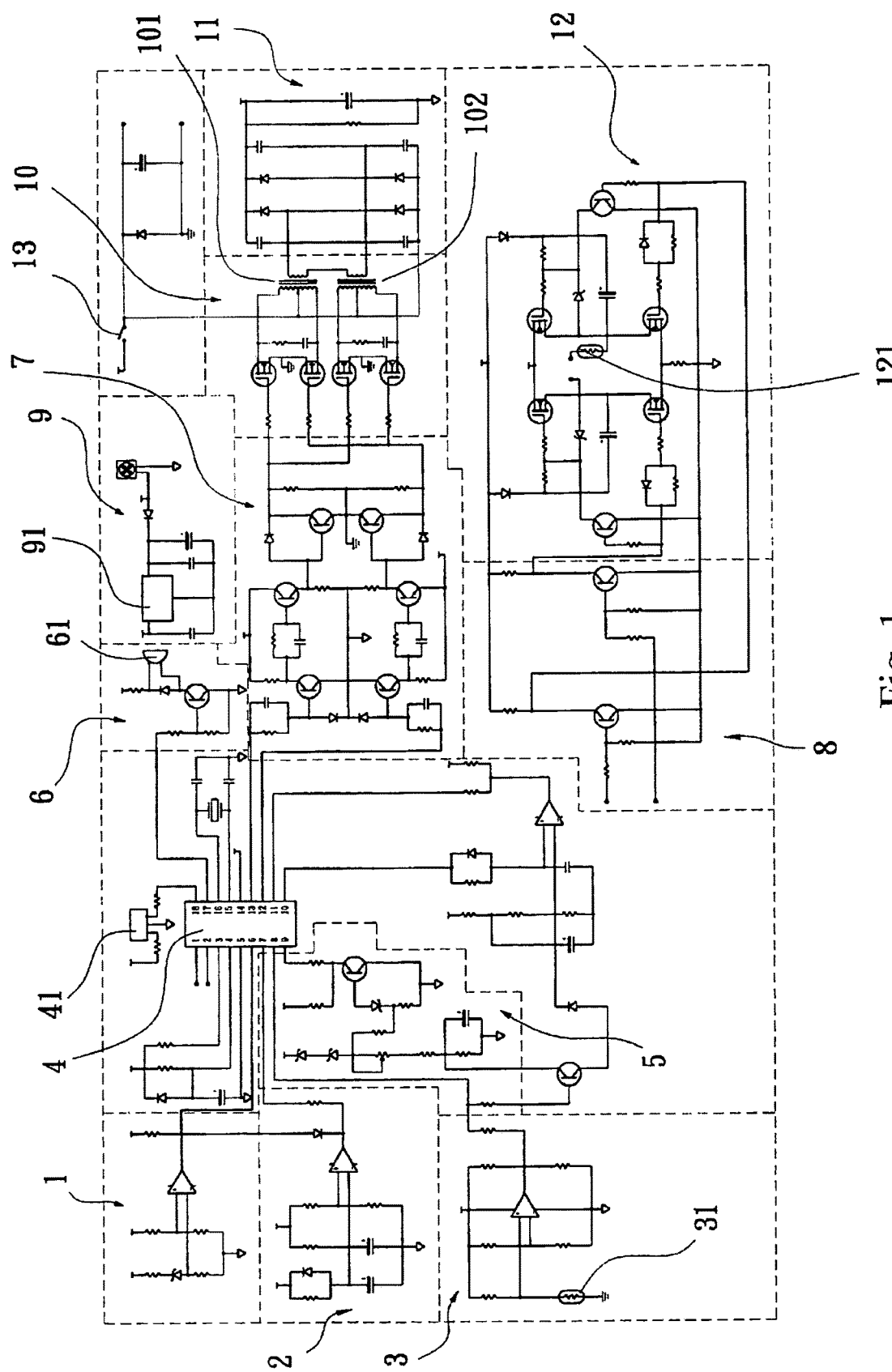
FIG. 1 is a circuit diagram of a digital power inverter of U.S. Pat. No. 6,646,849.

The drawings, described above, are provided for purposes of illustration, and not of limitation, of the aspects and features of various examples of embodiments of the invention described herein. The drawings are not intended to limit the scope of the claimed invention in any aspect. For simplicity and clarity of illustration, elements shown in the drawings have not necessarily been drawn to scale and the dimensions of some of the elements may be exaggerated relative to other elements for clarity.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

It will be appreciated that numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Further, this description is not to be considered as limiting the scope of the embodiments described herein in any way, but rather as merely describing implementation of the one or more embodiments described herein.

The embodiments of the systems and methods described herein may be implemented in hardware or software, or a combination of both. However, these embodiments may be implemented in computer programs executing on programmable computers, each computer including at least one processor, a data storage system (including volatile and non-volatile memory and/or storage elements), and at least one communication interface. For example, the programmable computers may be a server, network appliance, set-top box, embedded device, computer expansion module, personal computer, laptop, tablet, personal data assistant, or mobile device. Program code is applied to input data to perform the functions described herein and to generate output information. The output information is applied to one or more output devices. IN some embodiments, the communication interface may be a network communication interface. In some embodiments in which elements of the invention are combined, the communication interface may be a software communication interface, such as those for inter-process communication (IPC). In some embodiment, there may be a combination of communication interfaces.

Each program may be implemented in a high-level procedural or object-oriented programming or scripting language, or both, to communicate with a computer system. However, alternatively the programs may be implemented in assembly or machine language, if desired. In any case, the language may be a compiled or interpreted language. Each such computer program may be stored on a storage media or a device, such as ROM, hard drive, solid state hard drive, flash memory, or magnetic diskette, readable by a general or special purpose programmable computer, for configuring and operating the computer when the storage media or device is read by the computer when the storage media or device is read by the computer to perform the procedures described herein. The invention system may also be considered to be implemented as a non-transitory computer readable storage medium, configured with a computer program, where the storage medium so configured causes a computer to operate in a specific and predefined manner to perform the functions described herein.

In addition, the system, processes, and methods of the described embodiments are capable of being distributed in a computer program product including a physical non-transitory computer readable medium that bears computer usable instructions for one or more processors. The medium may be provided in various forms, including one or more diskettes, compact disks, tapes, chips, hard drive, solid state hard drive, flash memory, chips magnetic and electronic storage media, and the like. The computer usable instructions may also be in various forms, including compiled and non-compiled code.

Figure 2:
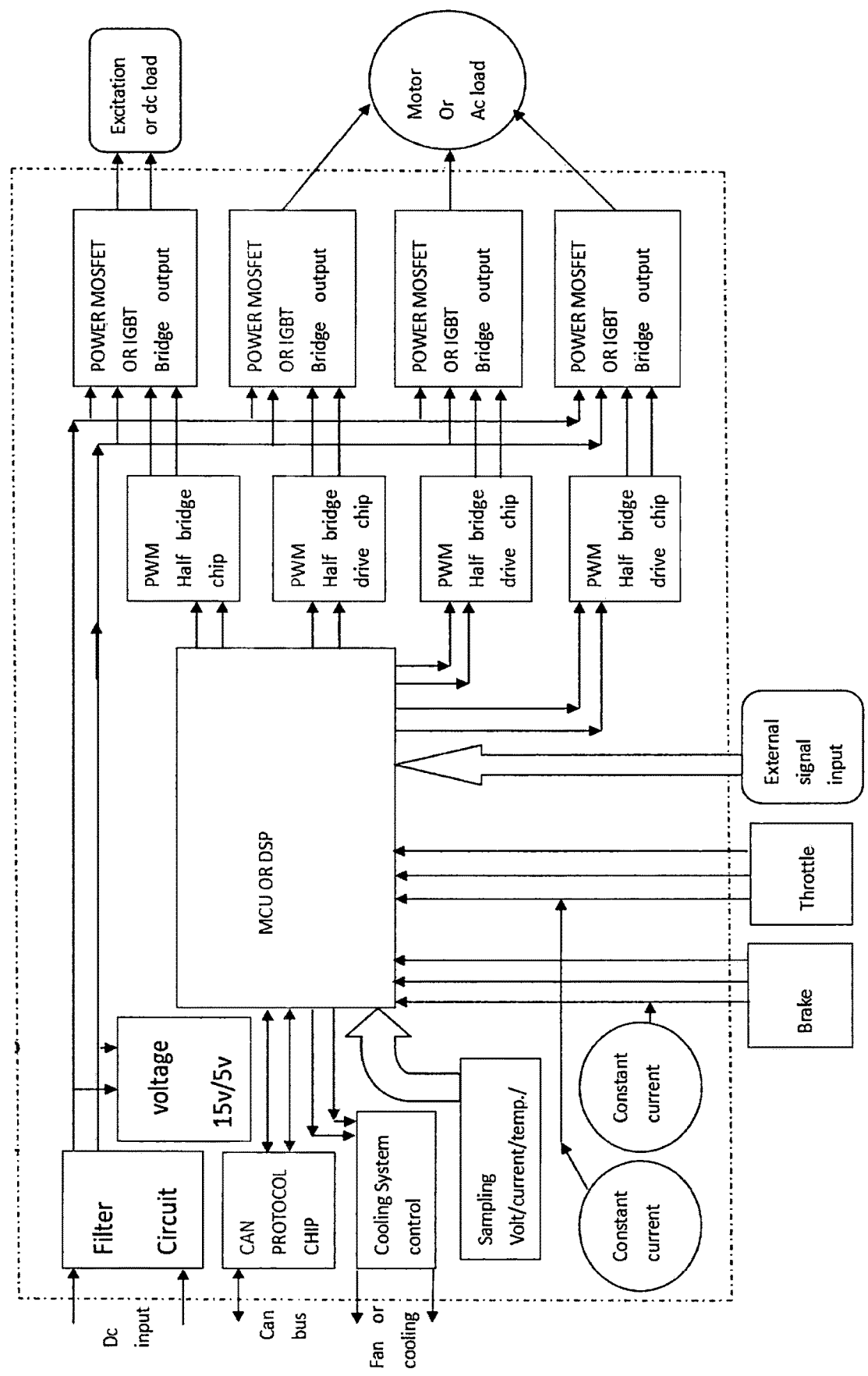
FIG. 2 is a block diagram of an three-phase digital power inverter system according to a preferred embodiment of the present invention.
Figure 3:
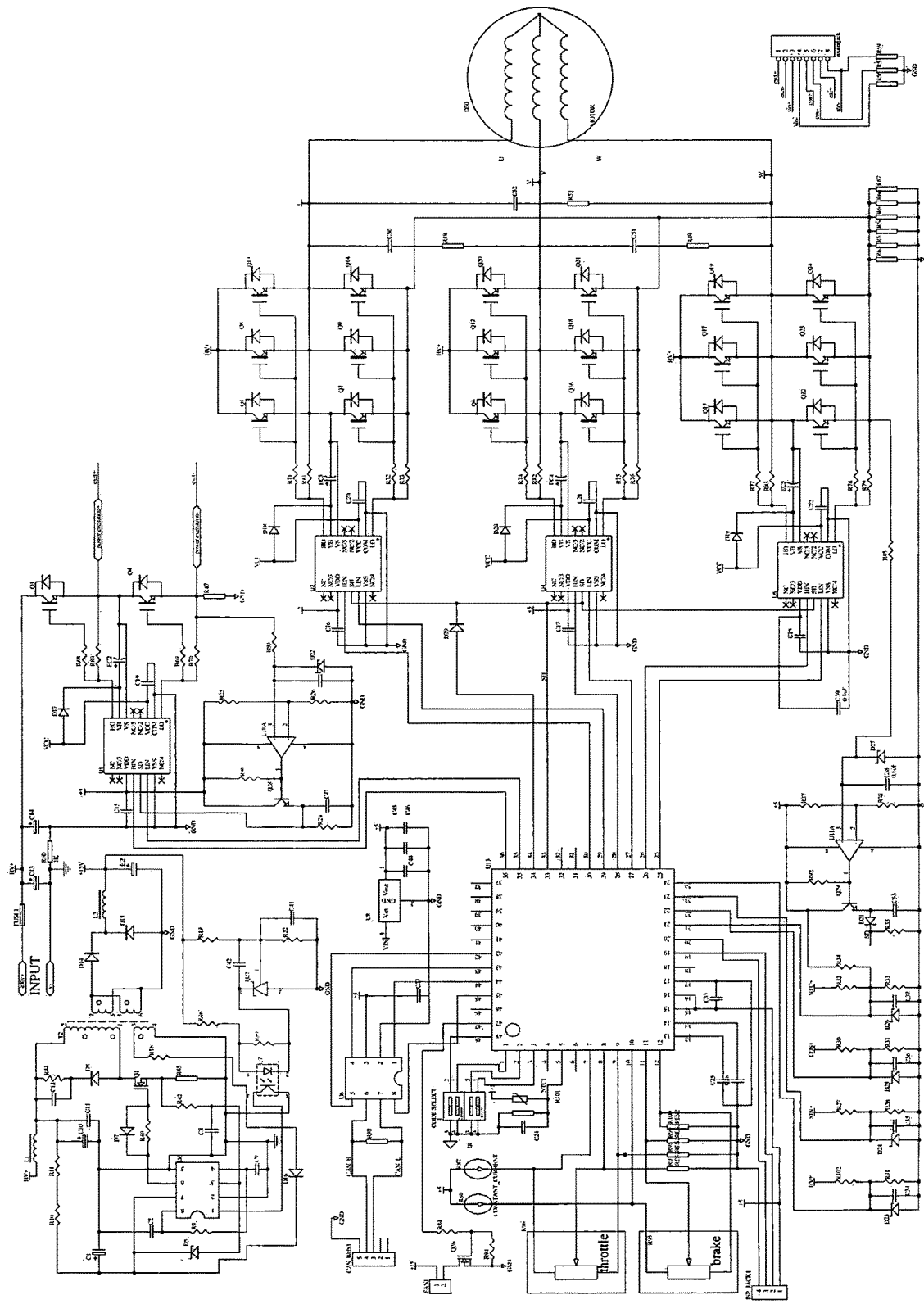
FIG. 3 is a circuit diagram of the three-phase digital power inverter system according to the above preferred embodiment of the present invention.

Referring to FIGS. 2 and 3, an three-phase digital power inverter system for motor controlling according to a preferred embodiment of the present invention is illustrated, which comprises a MCU (Micro Computer Unit or DSP) 1000 configured for acquisition of voltage, current, temperature data, outputting corresponding PWMs, intelligent start of cooling system, and automatic overvoltage protection (OVP), overcurrent protection (OCP), overtemperature protection (OTP), and etc., a high voltage driving circuitry 200, a DC to DC circuitry 300, and a main circuitry 400.

Referring to FIG. 1, the digital power inverter according to the U.S. Pat. No. 6,646,489 is illustrated, which comprises a current detecting circuit 1, an overload detecting circuit 2, a temperature detecting circuit 3, a CPU 4, a high voltage detecting circuit 5, an alarm circuit 6, a PWM driving circuit 7, an AC driving circuit 8, a voltage regulation circuit 9, a PWM converting circuit 10, a rectifying circuit 11, a DC/AC inverting circuit 12, and a switch 13.

The current detecting circuit 1, which has one end connected to the DC/AC inverting circuit 12 and another end connected to the CPU 4, comprises an operation amplifier (OPA) connected with a diode and a plurality of resistances, and is arranged for detecting whether an output means a short circuit or a false short circuit. The overload detecting circuit 2, which has one end connected to the DC/AC inverting circuit 12 and another end connected to the current detecting circuit 1 and then to the CPU 4, comprises an operation amplifier (OPA), a plurality of diodes, resistances and capacitors, and is arranged for detecting whether it is overloading and whether the input DC voltage is overly high or overly low. The temperature detecting circuit 3, which is connected directly to the CPU 4, comprises an operation amplifier (OPA), a heat sensitive resistance 31 and other resistances, and is arranged for detecting whether the temperature of the loading device such as a machine or a motor is overly high. The high voltage detecting circuit 5, which has one connected to the rectifying circuit 11 and another end connected to the CPU 4, comprises a plurality of transistors, diodes, resistances, a variable resistance, and a plurality of capacitors, and is arranged for detecting a high voltage state. The alarm circuit 6, which is directly connected with the CPU 4, a transistor, a plurality of diodes and resistances, and a buzzer 61, is arranged for detecting an abnormal state of the circuitry of the digital power inverter to provide an alarm. The PWM driving circuit 7, which has one end connected to the CPU 4 and another end connected to a PWM converting circuit 10, comprises a plurality of transistors, diodes, resistances and capacitors, and is arranged for amplifying and reshaping the output PWM signals of the CPU 4. The AC driving circuit 8, which has one end connected to the CPU 4 and another end connected to the DC/AC inverting circuit 12, comprises a plurality of transistors and resistances, and is arranged for amplifying the output AC driving signals of the CPU 4. The voltage regulation circuit 9, which comprises a voltage regulation IC 91, a plurality of diodes and capacitors, is arranged for power supplying for normal operation of the entire circuitry of the digital power inverter. The PWM converting circuit 10, which one end connected to the PWM driving circuit 7 and another end connected to the rectifying circuit 11, comprises a plurality of FET power transistors, resistances, capacitors and two transformers 101, 102. The PWM converting circuit 10 which is directly supplied with electric power in the mode of DC inputting is arranged for increasing the voltage of the driving signals amplified and reshaped by the PWM driving circuit 7 through the transformers to generate high frequency AC signals. The rectifying circuit 11, which one end connected to the PWM converting circuit 10 and another end connected to the DC/AC inverting circuit 12, having a high voltage AC output connecting point, comprises a plurality of diodes capacitors and resistances. The rectifying circuit 11, which is directly supplied with electric power in the mode of DC inputting, is arranged for rectifying the high frequency AC signals generated by the PWM converting circuit 10 to generate an AC high voltage. The DC/AC inverting circuit 12, which is connected to receive a DC input, has one end connected with the AC driving circuit 8 and the rectifying circuit 11 and another end connected separately with the current detecting circuit 1 and the overload detecting circuit 2. The DC/AC inverting circuit 12 further has an AC output connecting point and comprises a plurality of transistors, FET power transistors, diodes, diodes, resistances, capacitors and a heat sensitive resistance, that is arranged for converting DC high voltage signals provided by the AC driving circuit 8 into AC high voltage output.

Accordingly, the CPU 4, which controls by cooperation the working of the overload detecting circuit 2, turns off output in time before the output power makes the elements crumbled. A short time after restoration, the CPU 4 turns on output again. The process is repeated again and again intermittently to protect the elements of the digital power inverter from being damaged, such that the normal working power for a workload can be afforded and the larger actuating power for the machine can be provided. In addition, the CPU 4 can clearly distinguish a short circuit from a false short circuit according to whether the current is always the same or is gradually reduced and make suitable disposing. The CPU 4 is built with the above stated working circuits having normal values within their working scopes, in order to actively control and compare the above stated situations of the working circuits to adjust the output PWM signals and AC driving signals thereof, such that the output PWM signals can be modulated in pursuance of the loading state of working of the loops.

According to the present invention, the digital power inverter as shown in FIG. 1 is integrated and improved in the three-phase digital power inverter system as shown in FIGS. 2 and 3, wherein a plurality of circuits in the digital power inverter as shown in FIG. 1 is replaced by a high voltage driving circuitry 200, a DC to DC circuitry 300 and a main circuitry 400 as illustrated in FIGS. 4-7.

Figure 4:
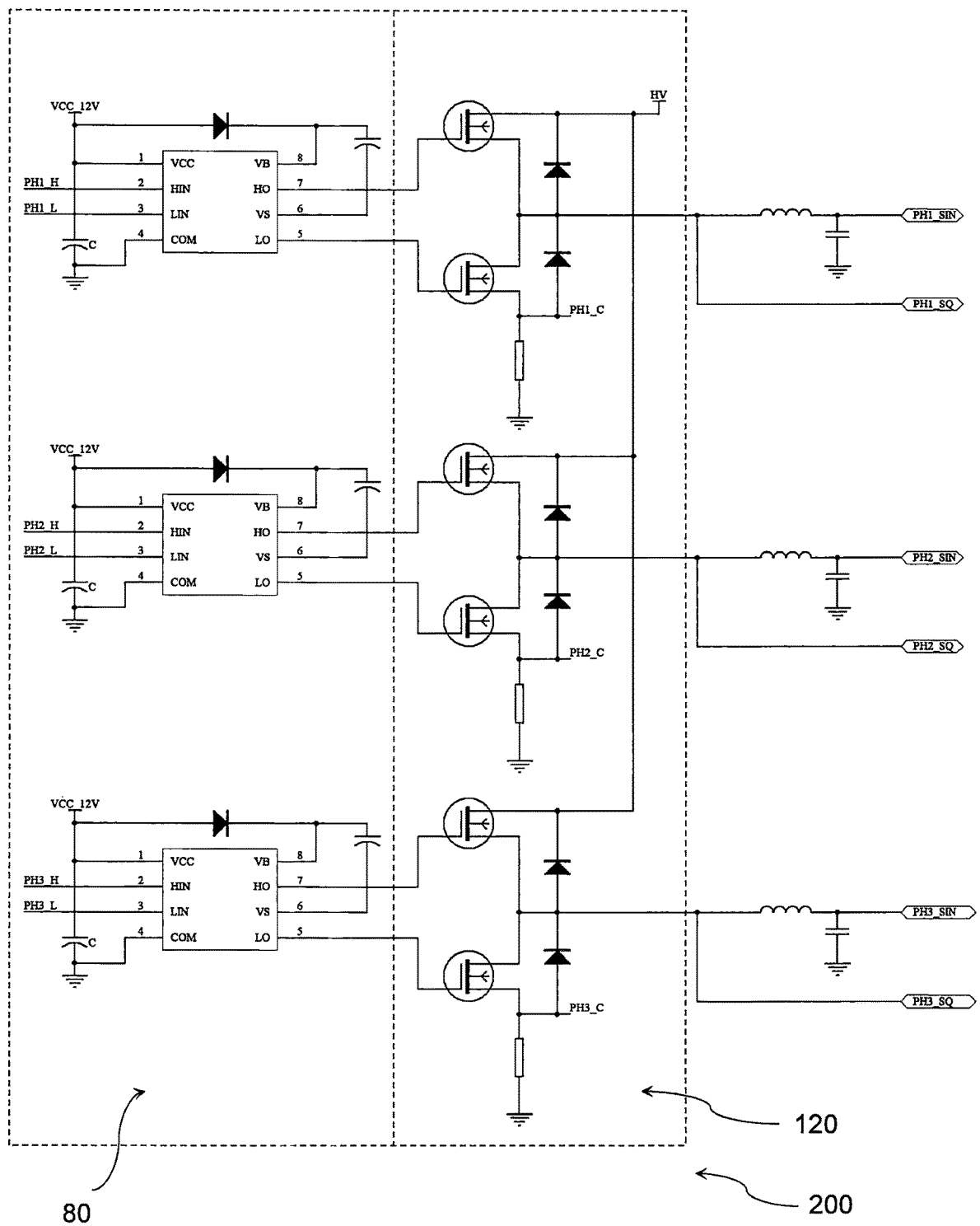
FIG. 4 is a partial circuit diagram illustrating a high voltage driving circuitry of the three-phase digital power inverter system according to the above preferred embodiment of the present invention.

Please referring to FIG. 4, the high voltage driving circuitry 200 of the three-phase digital power inverter system is illustrated, which comprises an AC driving circuit 80 and an inverting circuit 120. The AC driving circuit 80 is improved by integrated circuit configuration in the present invention from the AC driving circuit 8 as shown in FIG. 1 to output multi-phase AC power in additional to single-phase AC power. For example, a three-phase/single phase power output is embodied. The inverting circuit 120 is improved from the DC/AC inverting circuit 12 as shown in FIG. 1, wherein the inverting circuitry 120 includes a three-phase half-bridge circuit comprising four PWM half-bridge chips configured to output three-phase power through four Power Bridge outputs, such as MOSFET (Metal-Oxide-Semiconductor Field-Effect Transistor) or IGBT (Insulated-Gate Bipolar Transistor) Bridge outputs, as shown in FIGS. 2-4, or alternatively to output any two-phase power to obtain a single-phase power output, wherein it can be determined by the output signal of the MCU 1000. It is worth mentioning that although the circuitry as shown in FIG. 4 is not isolated design, to person skilled in the art would understand that isolated circuit design is also applicable under the safety specifications or application requirements for isolating output noise, and that the high-power components equipped in the inverting circuit 12 are not limited to the MOSFET (or IGBT) as shown in FIG. 4.

Figure 5:
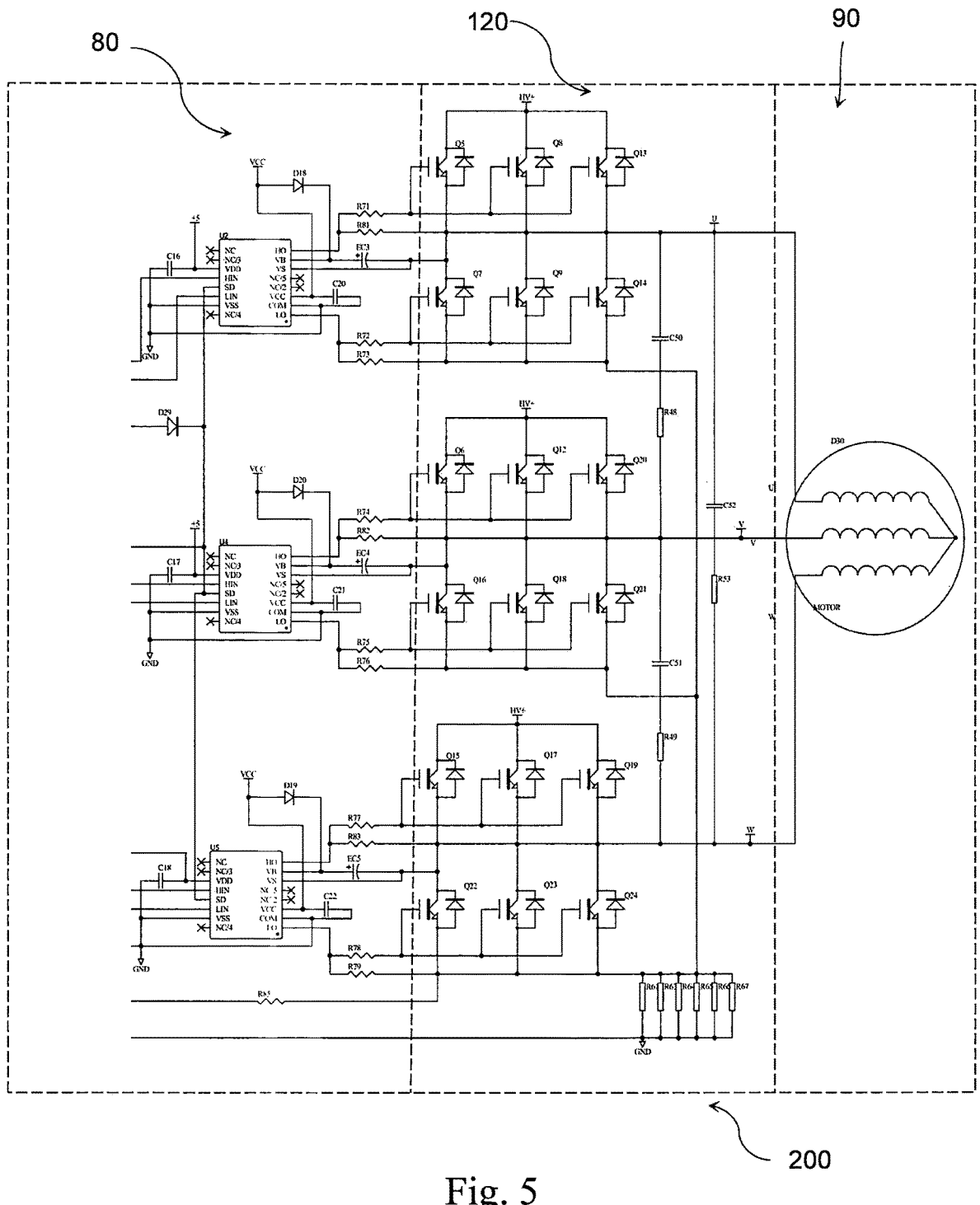
FIG. 5 is a partial circuit diagram of FIG. 3 illustrating the high voltage driving circuitry of the three-phase digital power inverter system according to the above preferred embodiment of the present invention.

Referring to FIG. 5, an alternative mode of the high voltage driving circuitry 200 modified from FIG. 4 is illustrated, wherein the MOSFET (or IGBT) of the driving output of the inverting circuit 12 can be increased or decreased according to power needs to form a load controller circuit 90 as shown in FIG. 5, or other AC loads, wherein the AC driving circuit 80 is an integrated circuit selected from various chips according to the needs of the output driving power and is not limited to the number of chip pins.

Figure 6:
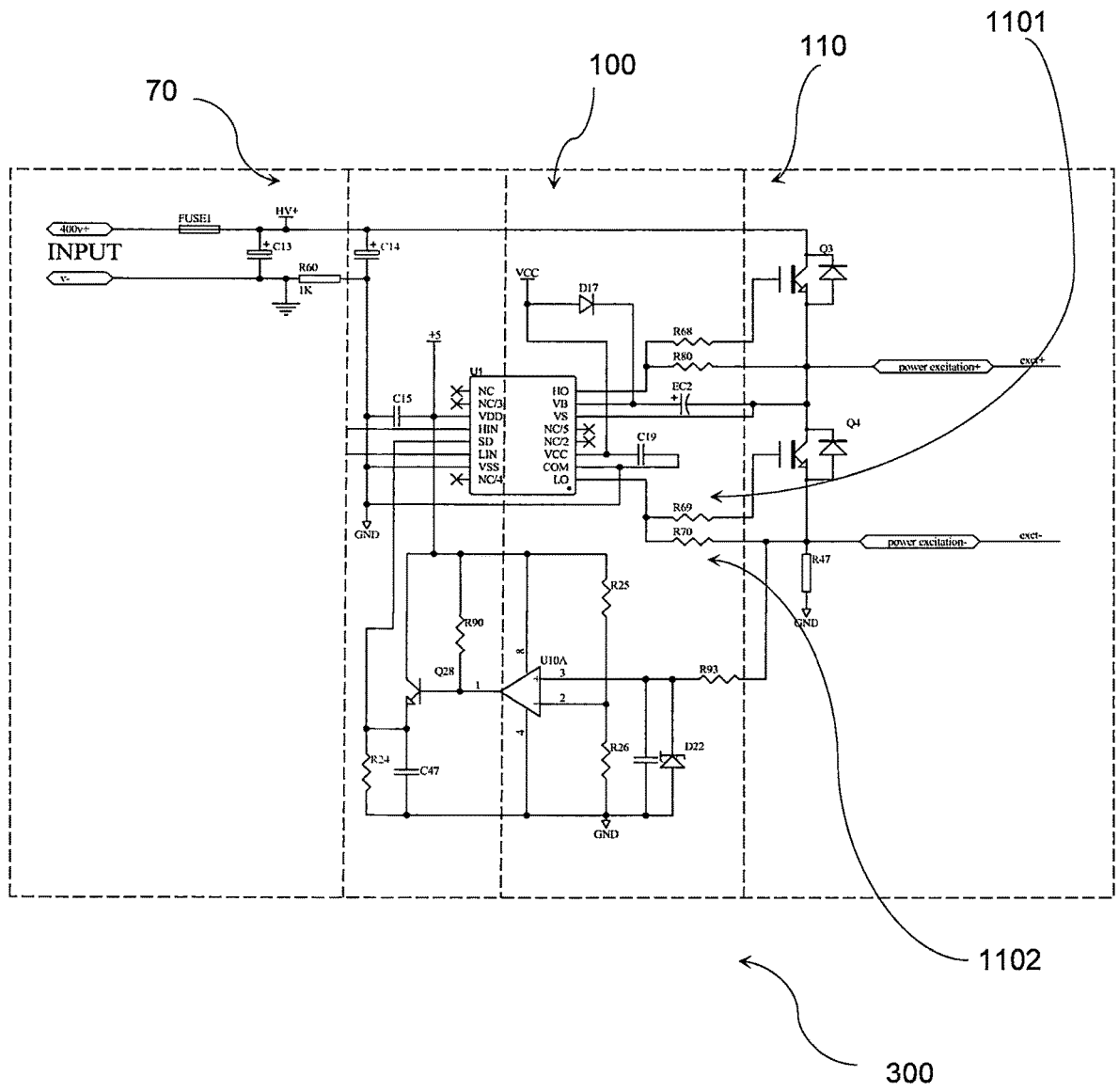
FIG. 6 is a partial circuit diagram illustrating the DC to DC circuitry of the three-phase digital power inverter system according to the above preferred embodiment of the present invention.

Referring to FIG. 6, the DC to DC circuitry 300 of the three-phase digital power inverter system according to the preferred embodiment is illustrated, wherein the DC to DC circuitry 300 comprises a power driving circuit 70 and a power converting circuit 100. The power driving circuit 70 is an integrated circuit to provide a circuit function and a digital inverter function, wherein the MCU 1000 outputs PWM control for the power driving circuit 70, and the power converting circuit 100 is modified from the push-pull output to a half-bridge output such that a step-down/step-up circuit 110 can be a direct output connected to a DC load, such as a motor, through the load controller circuit 90 and becomes a step-down circuit, or can be connected to one or more transformers 1101, 1102 and becomes a step-up circuit.

Figure 7:
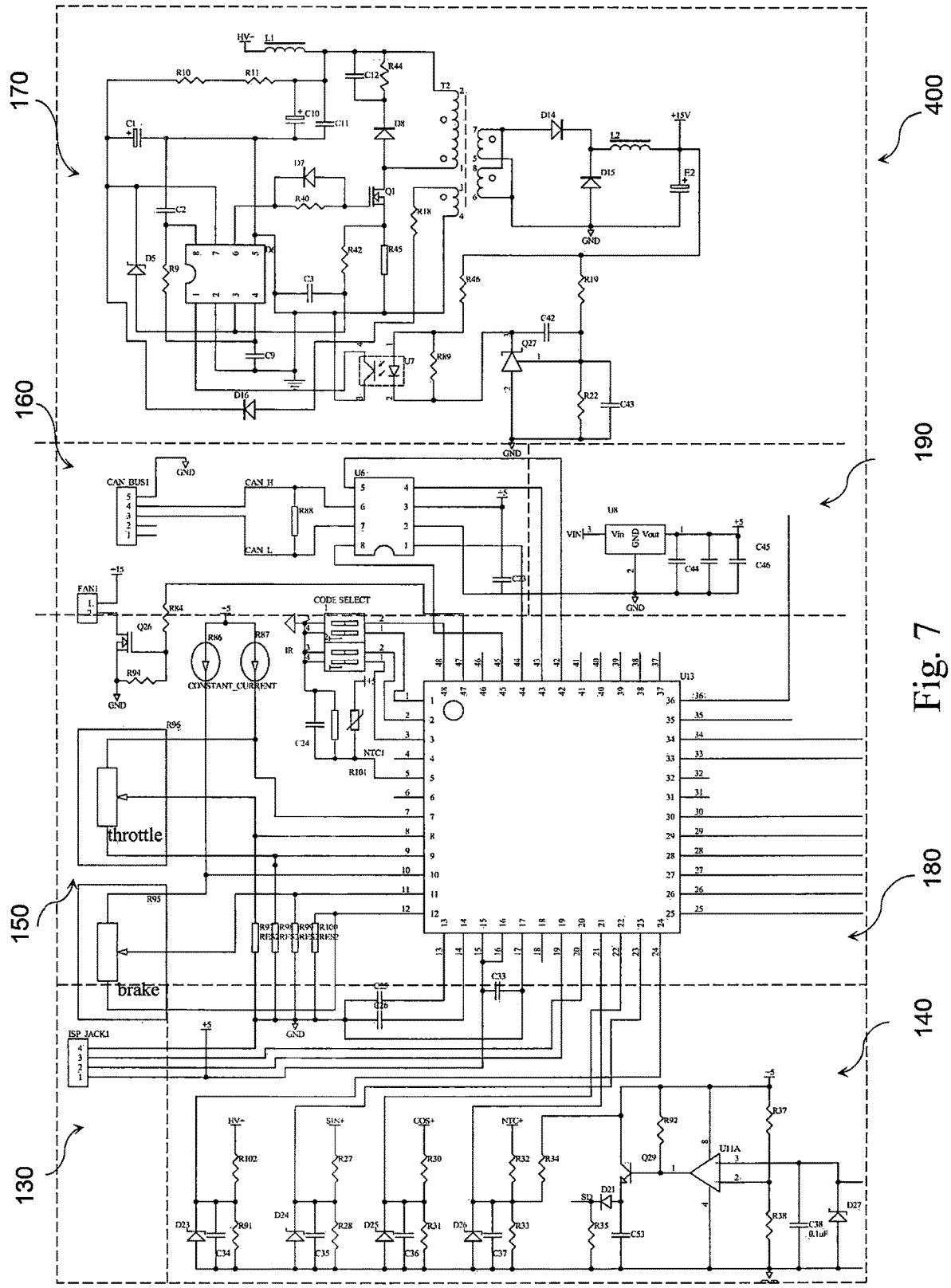
FIG. 7 is a partial circuit diagram illustrating the main circuitry of the three-phase digital power inverter system according to the preferred embodiment of the present invention.

Referring to FIG. 7, the main circuitry 400 of the three-phase digital power inverter system according to the preferred embodiment is illustrated, which comprises an output loop circuit 130, a detecting circuit 140, a constant current power source circuit 150, a communication chip circuit 160, such as a CAN communication chip circuit, two voltage regulation circuits 170, 190, and a CPU circuit 180. The CPU circuit 180 comprises a CPU selected from a group consisting of a MCU or a DSP. The detecting circuit 140 comprises an overload detecting circuit, a current detecting circuit for current sampling, a voltage detecting circuit for voltage sampling, and a temperature detecting circuit for temperature sampling, which are arranged between the CPU circuit 180 and the output loop circuit 130. The current sampling, voltage sampling and temperature sampling are inputted to the CPU of the CPU circuit 180 to achieve a basis for quantification and calculation of internal circuit data, which further expands to the CAN communication chip of the CAN communication chip circuit 160 so as to achieve a data exchange with remote control or an external user (human-machine) interface. When the three-phase digital power inverter system is applied in motoring controlling of an electric motor vehicle, an accelerator control and a brake control are achieved by combining three output currents of three power wires of the constant current power source circuit 150 to input to the CPU, embodied as the MCU 1000 or DSP, of the CPU circuit 180, wherein through a software computation algorithm A=B+C, where A is the first resistance of the first power wire, B is the second resistance of the second power wire and C is the third resistance of the third power wire, various failure state detections of the accelerator and brake components of the electric motor vehicle are accomplished, so that emergency deceleration and parking can be performed even without human awareness, that effectively prevents speedy or unpredictable accidents. The voltage regulation circuits 170, 190 are arranged for internal stable supply voltage. The output loop circuit 130 comprises external programming interface terminals which are adapted for changing the software of the MCU 1000 of the CPU circuit according to the needs to the software.

According to the present invention, the three-phase digital power inverter system is controlled interiorly by the MCU 1000 while the detecting circuit 140, including the overload detecting circuit, the current detecting circuit, the voltage detecting circuit and the temperature detecting circuit, is provided between the CPU circuit 180 and the output loop circuit 130. The three-phase digital power inverter system is also provided interiorly with the PWM converting circuit 100, the AC driving circuit 80, the voltage regulation circuits 170, 190, and the inverting circuit 120, wherein the MCU 1000 is controlled by cooperating the working of the overload detecting circuit and turning off output in time before the output power making the elements of the three-phase digital power inverter system being crumbled and a short time after restoration, and then the MCU 1000 turns on the output again. In a mode of continuous on/off outputting, the MCU 1000 clearly distinguishes a short circuit from a false short circuit according to variation of the output currents detected and makes suitable disposing of deciding whether power supplying is continued. The MCU 1000 actively controls and compares the situations of the circuits to adjust the output PWM signals and AC driving signals of them in pursuance of the loading state of working of loops.

The three-phase digital power inverter system of the present invention is specifically equipped in the electric motor vehicle for motor controlling that includes the following steps:

(a) controlling three half-bridges of the three-phase half-bridge circuit of the inverting circuitry 120 through the three-phase PWM outputs from the PWM half-bridge chips connected to the MCU 1000, as shown in FIGS. 2 and 4, to achieve a three-phase AC power output;

(b) inputting variable resistances of the three power wires A, B, C powered by the constant current power source circuit 150 as accelerator control signals to the MCU 1000 for quantification and calculation so as to effectively control the rotation speed of the motor and to determine the failure state according to the computation algorithm A=B+C, so as to prevent any failure of the accelerator controller device from causing the motor speed to run out of control; and (c) inputting variable resistances of the three power wires A, B, C powered by the constant current power source circuit 150 as brake control signals to the MCU 1000 for quantification and calculation so as to effectively control the rotation speed of the motor and to determine the failure state according to the computation algorithm A=B+C, so as to prevent any failure of the brake controller device from causing the motor to brake or brake failure.

In view of above, during the constant current power source for the accelerator control in combination with a three-wire potentiometer are inputted to the MCU for quantification and calculation based on the computation algorithm A=B+C mode to obtain data, the accelerator line state and the brake line state are detected simultaneously for whether they are working well individually, so as to effectively prevent any electrical failure due to mechanical failure of the accelerator or the brake or open circuit/short circuit of the accelerator line or the brake line that may cause accident due to out of control of the accelerator or brake respectively. These are the potential risk factors of electric motor vehicles while the present invention can substantially eliminate such potential factor and provide a more reliable performance of electric motor vehicles.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A digital power inverter system for motor controlling, comprising:

a main circuitry which comprises an output loop circuit, a detecting circuit, a constant current power source circuit, a communication chip circuit, two voltage regulation circuits and a CPU circuit, wherein the constant current power source circuit comprises a first power wire, a second power wire and a third power wire, wherein the voltage regulation circuits are arranged for internal stable supply voltage, wherein the communication chip circuit comprises a communication chip, wherein the CPU circuit comprises a CPU selected from a group consisting of a MCU and a DSP, wherein the detecting circuit comprises an overload detecting, a current detecting circuit for current sampling, a voltage detecting circuit for voltage sampling and a temperature detecting circuit for temperature sampling, which are arranged between the CPU circuit and the output loop circuit in such a manner that the current sampling, voltage sampling and temperature sampling are inputted to the CPU for quantification and calculation through a computation algorithm A=B+C, where A is a first resistance of the first power wire, B is a second resistance of the second power wire and C is a third resistance of the third power wire, and then expands to the communication chip of the communication chip circuit so as to achieve a data exchange;

a high voltage driving circuitry which comprises an AC driving circuit which is configured to output multiphase AC power, a load controller circuit and an inverting circuit which is arranged between the AC driving circuit and the load controller circuit and includes a three-phase half bridge circuit configured to selectively output three-phase power or two-phase power to obtain a single-phase power output, determining by output signals of the CPU; and a DC to DC circuitry comprising a power driving circuit, a step-down/step-up circuit and a power converting circuit, wherein the power driving circuit is configured to provide a circuit function and a digital inverter function, wherein the CPU outputs PWM control for the power driving circuit and the power converting circuit is configured to output a half-bridge output such that the step down/step up circuit is arranged to be able to selectively be a direct output connected to a DC load through the load controller circuit and becomes a step-down circuit, or connected to one or more transformers and becomes a step-up circuit;

thereby an accelerator control and a brake control to a rotation of a motor equipped with the digital power inverter system are achieved by combining the first, second and third power wires to input to the CPU for computation through the software computation algorithm A=B+C, one or more failure state detections of accelerating and braking of the rotation of the motor are accomplished.

2. The digital power inverter system, as recited in claim 1, wherein the power converting circuit is a PWM converting circuit, wherein the CPU is controlled by cooperating a working of the overload detecting circuit and turning off an output in time before an output power making the digital power inverter system being crumbled and a short time after restoration, and then the CPU turns on the output again.

3. The digital power inverter system, as recited in claim 2, wherein in a mode of continuous on/off outputting, the CPU distinguishes a short circuit from a false short circuit according to variation of the output currents detected and makes suitable disposing of deciding whether power supplying is continued, such that the CPU actively controls and compares situations of the digital power inverter system to adjust output PWM signals and AC driving signals thereof in pursuance of a loading state thereof.

4. The digital power inverter system, as recited in claim 1, wherein the output loop circuit comprises external programming interface terminals adapted for changing a software of the CPU of the CPU circuit.

5. The digital power inverter system, as recited in claim 1, wherein the three-phase half-bridge circuit of the inverting circuit includes four PWM half-bridge chips configured to output three-phase power through four Power Bridge outputs, wherein a MOSFET of a driving output of the inverting circuit is increased or decreased according to power needs to form the load controller circuit.

6. The digital power inverter system, as recited in claim 2, wherein the three-phase half-bridge circuit of the inverting circuit includes four PWM half-bridge chips configured to output three-phase power through four Power Bridge outputs, wherein a MOSFET of a driving output of the inverting circuit is increased or decreased according to power needs to form the load controller circuit.

7. The digital power inverter system, as recited in claim 3, wherein the three-phase half-bridge circuit of the inverting circuit includes four PWM half-bridge chips configured to output three-phase power through four Power Bridge outputs, wherein a MOSFET of a driving output of the inverting circuit is increased or decreased according to power needs to form the load controller circuit.

8. The digital power inverter system, as recited in claim 4, wherein the three-phase half-bridge circuit of the inverting circuit includes four PWM half-bridge chips configured to output three-phase power through four Power Bridge outputs, wherein a MOSFET of a driving output of the inverting circuit is increased or decreased according to power needs to form the load controller circuit.

9. A motor controlling process through a digital power inverter system equipped with a motor of an electric motor vehicle, the digital power inverter system comprising:

a main circuitry which comprises an output loop circuit, a detecting circuit, a constant current power source circuit, a CAN communication chip circuit, two voltage regulation circuits and a CPU circuit, wherein the constant current power source circuit comprises a first power wire, a second power wire and a third power wire, wherein the voltage regulation circuits are arranged for internal stable supply voltage, wherein the communication chip circuit comprises a communication chip, wherein the CPU circuit comprises a CPU selected from a group consisting of a MCU and a DSP, wherein the detecting circuit comprises an overload detecting, a current detecting circuit for current sampling, a voltage detecting circuit for voltage sampling and a temperature detecting circuit for temperature sampling, which are arranged between the CPU circuit and the output loop circuit in such a manner that the current sampling, voltage sampling and temperature sampling are inputted to the CPU for quantification and calculation through a computation algorithm A=B+C, where A is a first resistance of the first power wire, B is a second resistance of the second power wire and C is a third resistance of the third power wire, and then expands to the communication chip of the communication chip circuit so as to achieve a data exchange;

a high voltage driving circuitry which comprises an AC driving circuit which is configured to output multi-phase AC power, a load controller circuit and an inverting circuit which is arranged between the AC driving circuit and the load controller circuit and includes a three-phase half bridge circuit configured to selectively output three-phase power or two-phase power to obtain a single-phase power output, determining by output signals of the CPU; and a DC to DC circuitry comprising a power driving circuit, a step-down/step-up circuit and a power converting circuit, wherein the power driving circuit is configured to provide a circuit function and a digital inverter function, wherein the CPU outputs PWM control for the power driving circuit and the power converting circuit is configured to output a half-bridge output such that the step down/step up circuit is arranged to be able to selectively be a direct output connected to a DC load through the load controller circuit and becomes a step-down circuit, or connected to one or more transformers and becomes a step-up circuit;

the motor controlling process comprising steps of:

controlling three half-bridges of the three-phase half-bridge circuit of the inverting circuitry through the three-phase PWM outputs from the PWM half-bridge chips connected to the CPU to achieve a three-phase AC power output;

inputting variable resistances of the first, second and third power wires powered by the constant current power source circuit as accelerator control signals to the CPU for quantification and calculation so as to effectively control a rotation speed of a motor and to determine a failure state according to the software computation algorithm A=B+C, so as to prevent any failure of an accelerator controller device from causing the rotation speed of the motor to run out of control; and inputting variable resistances of the first, second and third power wires powered by the constant current power source circuit as brake control signals to the CPU for quantification and calculation so as to effectively control the rotation speed of the motor and to determine a failure state according to the computation algorithm A=B+C, so as to prevent any failure of a brake controller device from causing the motor to brake or brake failure.

\* \* \* \* \*